United States Patent
Halliyal et al.

(10) Patent No.: US 6,451,641 B1
(45) Date of Patent: Sep. 17, 2002

(54) NON-REDUCING PROCESS FOR DEPOSITION OF POLYSILICON GATE ELECTRODE OVER HIGH-K GATE DIELECTRIC MATERIAL

(75) Inventors: Arvind Halliyal, Cupertino, CA (US); Robert Bertram Ogle, Jr., San Jose, CA (US); Joong S. Jeon, Cupertino, CA (US); Fred Cheung, San Jose, CA (US); Effiong Ibok, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/085,348

(22) Filed: Feb. 27, 2002

(51) Int. Cl.$^7$ .............................................. H01L 21/336
(52) U.S. Cl. ...................... 438/200; 438/287; 438/488; 438/591
(58) Field of Search ................ 438/261, 287, 438/591, 197, 488, 585, 592

(56) References Cited

U.S. PATENT DOCUMENTS

| | | | |
|---|---|---|---|
| 4,481,229 A | | 11/1984 | Suzuki et al. .................. 427/38 |
| 6,020,024 A | * | 2/2000 | Maiti et al. ............... 427/248.1 |
| 6,110,784 A | * | 8/2000 | Gardner et al. ............. 257/411 |
| 6,297,107 B1 | | 10/2001 | Paton et al. ................. 438/291 |
| 6,407,435 B1 | * | 6/2002 | Ma et al. ..................... 257/406 |
| 2002/0064970 A1 | * | 5/2002 | Chooi et al. ................ 438/785 |

* cited by examiner

Primary Examiner—Tuan H. Nguyen
(74) Attorney, Agent, or Firm—Renner, Otto, Boisselle & Sklar, LLP

(57) ABSTRACT

A process for fabricating a semiconductor device, including providing a semiconductor substrate; depositing on the semiconductor substrate a layer of a high-K gate dielectric material; depositing on the gate dielectric material layer a polysilicon or polysilicon-germanium gate electrode layer, in which the step of depositing the polysilicon or polysilicon-germanium gate electrode layer includes providing non-reducing conditions in a CVD apparatus.

20 Claims, 2 Drawing Sheets

NON-REDUCING PROCESS FOR DEPOSITION OF POLYSILICON GATE ELECTRODE OVER HIGH-K GATE DIELECTRIC MATERIAL

TECHNICAL FIELD

The invention relates generally to the fabrication of semiconductor devices and, more particularly, to the fabrication of a gate electrode over a gate dielectric layer in semiconductor devices.

BACKGROUND ART

Fabrication of a semiconductor device and an integrated circuit thereof begins with a semiconductor substrate and employs film formation, ion implantation, photolithographic, etching and deposition techniques to form various structural features in or on a semiconductor substrate to attain individual circuit components which are then interconnected to ultimately form an integrated semiconductor device. Escalating requirements for high densification and performance associated with ultra large-scale integration (ULSI) semiconductor devices requires smaller design features, increased transistor and circuit speeds, high reliability and increased manufacturing throughput for competitiveness. As the devices and features shrink, and as the drive for higher performing devices escalates, new problems are discovered that require new methods of fabrication or new arrangements or both.

There is a demand for large-scale and ultra large-scale integration devices employing high performance metal-oxide-semiconductor (MOS) devices. MOS devices typically comprise a pair of ion implanted source/drain regions in a semiconductor substrate and a channel region separating the source/drain regions. Above the channel region is typically a thin gate dielectric material, usually referred to as a gate oxide, and a conductive gate comprising conductive polysilicon or another conductive material. In a typical integrated circuit, a plurality of MOS devices of different conductivity types, such as n-type and p-type, and complementary MOS (CMOS) devices employing both p-channel and n-channel devices are formed on a common substrate. MOS technology offers advantages of significantly reduced power density and dissipation as well as reliability, circuit performance and cost advantages.

The drive towards increased miniaturization and the resultant limits of conventional gate oxide layers have served as an impetus for the development of newer, high dielectric constant ("high-K") materials as substitutes for conventional silicon dioxide-based gate oxide layers. Since the drain current in a MOS device is inversely proportional to the gate oxide thickness, the gate oxide is typically made as thin as possible commensurate with the material's breakdown field and reliability.

Decreasing the thickness of the gate oxide layer between the gate electrode and the source/drain extension regions together with the relatively high electric field across the gate oxide layer, can undesirably cause charge carriers to tunnel across the gate oxide layer. This renders the transistor "leaky", degrading its performance. To alleviate this problem, high-K dielectric materials are used as the gate insulator. Herein, a high-K gate oxide may be referred to as a high-K gate dielectric material layer, in order to emphasize that the gate dielectric comprises a high-K dielectric material rather than silicon dioxide.

One problem which has been encountered in integrating high-K dielectric materials into CMOS devices, and other semiconductor devices such as EEPROMs and other flash memory devices, is the undesirable interaction between many high-K dielectric materials and the silicon used in other semiconductor device structures. Of particular concern is the interaction between the polysilicon typically used for the gate electrode and the high-K material used for the high-K gate dielectric material. Such undesirable interactions are not confined to CMOS devices, but may also occur between polysilicon gate structures and high-K dielectric insulation layers in SONOS-type devices such as the MIRRORBIT™ flash memory cell available from Advanced Micro Devices, Inc., Sunnyvale, California, and in floating gate flash memory cells.

One of the undesirable interactions which may occur is the reduction of the metal oxide of a high-K gate dielectric material by hydrogen used in forming a polysilicon gate electrode on a high-K gate dielectric material layer.

Hence, it would be highly advantageous to develop a process that would permit the use of optimum materials in the formation of the gate electrode structure. It would also be highly advantageous to develop methodologies capable of optimum MOS transistor formation. Accordingly, there exists a need for a process of manufacturing MOS semiconductor devices with a high-K dielectric material layer that improves device performance, while avoiding undesirable interactions between elements such as polysilicon in gate electrodes and the high-K gate dielectric materials. In particular, a need remains for a process of forming a polysilicon gate electrode over a high-K gate dielectric material while avoiding reduction of the metal oxide at the interface between the polysilicon gate electrode and the high-K dielectric layer.

DISCLOSURE OF INVENTION

The present invention relates to a process of fabricating a semiconductor device including a high-K dielectric material for a gate dielectric, including steps of providing a semiconductor substrate; depositing on the semiconductor substrate a layer comprising a high-K gate dielectric material; depositing on the layer comprising a high-K gate dielectric material a polysilicon gate electrode layer, wherein the step of depositing the polysilicon gate electrode layer includes providing non-reducing conditions in a CVD apparatus. In one embodiment, the non-reducing conditions include providing a source of silicon which is free of hydrogen. In another embodiment, the non-reducing conditions include providing controlled oxidizing conditions in the CVD apparatus. In another embodiment, the non-reducing conditions include providing a source of silicon which contains a relatively reduced amount of hydrogen and providing oxidizing conditions in the CVD apparatus.

Thus, the present invention overcomes the problem of forming a polysilicon gate electrode over a high-K gate dielectric material while avoiding reduction of the metal oxide at the interface between the polysilicon gate electrode and the high-K dielectric layer.

MODES FOR CARRYING OUT THE INVENTION

Figure 1:
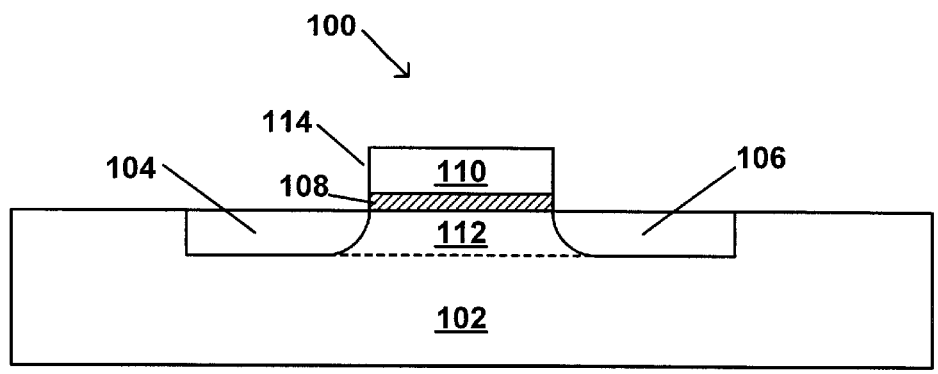
FIG. 1 is a schematic cross-sectional view of an exemplary CMOS structure in accordance with the present invention.

As used herein, the term "standard-K dielectric material" refers to a dielectric material having a K up to about 10. Such standard-K dielectric materials include, for example, silicon dioxide, which has a K of about 4, silicon oxynitride, which has a K of about 4–8 depending on the relative content of oxygen and nitrogen, and silicon nitride, which has a K of about 6–9, and aluminum oxide, which has a K of about 10.

As used herein, the term "high-K dielectric material" refers to a dielectric material having a K greater than about 10. Such high-K dielectric materials include, for example, $HfO_2$, $ZrO_2$ and others known in the art, some of which are specifically identified more fully below. In general, the term "high-K dielectric material" encompasses binary, ternary and higher oxides and any ferroelectric material having a K of about 10 or more. High-K dielectric materials may also include, for example, composite materials such as hafnium silicate, which has a K of about 14, and hafnium silicon oxynitride, which has a K of about 16, depending on the relative content of oxygen and nitrogen, and hafnium silicon nitride, which has a K of about 18.

As used herein, the term "composite dielectric material" refers to a dielectric material comprising the elements of at least two other dielectric materials. A composite dielectric material generally has a K value as defined above for a high-K dielectric material. As described in more detail below, a composite dielectric material may be formed by co-deposition of its component elements, or by sequential deposition followed by a treatment step, e.g., thermal treatment, to combine the elements to form the composite dielectric material.

As used herein, the term "polysilicon-germanium" refers to a mixture of polysilicon and germanium, in which the germanium content varies from slightly more than zero up to about 60% by weight by the mixture. Thus, the amount of germanium may range from a doping amount up to about 60% by weight, of the mixture. The polysilicon-germanium may be formed by any method known in the art, i.e., by doping polysilicon with germanium, or by co-deposition, for example.

Using a high-K dielectric material for the gate dielectric layer provides a low electrical thickness to be achieved while retaining a physically thick layer. For example, a high-K gate dielectric with a K of 40 and a thickness of 100 angstroms is substantially electrically equivalent to a silicon dioxide gate dielectric (K about 4) having a thickness of about 10 angstroms. The electrically equivalent thickness of high-K materials may be referred to in terms of the equivalent oxide thickness of a layer of silicon dioxide. Thus, a high-K gate dielectric layer having K value of 40 and a given physical thickness has an equivalent oxide thickness which is approximately 1/10 the given physical thickness. For higher-K dielectric materials, even thicker gate dielectric material layers can be formed while maintaining equivalent oxide thickness values lower than are possible with very thin silicon dioxide layers. In this way, the reliability problems associated with very thin dielectric layers may be avoided while transistor performance is increased.

Approximate K-values or, in some cases, a range of K-values, are shown below in Table 1 for several exemplary dielectric materials. It is understood that the present invention is not limited to the specific dielectric materials disclosed herein, but may include any appropriate standard-K, high-K and composite dielectric materials which are known and are compatible with the remaining elements of the semiconductor device with which the dielectric materials are to be used.

TABLE 1

| Dielectric Material | Approximate Dielectric Constant (K) (Relative Permittivity) |
|---|---|
| silicon dioxide | 4 |
| silicon nitride | 6–9 |
| silicon oxynitride | 4–8 |
| aluminum oxide | 10 |
| zirconium silicate | 12 |
| hafnium silicate | 15 |
| hafnium aluminate | 12–20 |
| lanthanum oxide, $La_2O_3$ | 20–30 |
| hafnium oxide, $HfO_2$ | 40 |
| zirconium oxide, $ZrO_2$ | 25 |
| cerium oxide, $CeO_2$ | 26 |
| bismuth silicon oxide, $Bi_4Si_2O_{12}$ | 35–75 |
| titanium dioxide, $TiO_2$ | 30 |
| tantalum oxide, $Ta_2O_5$ | 26 |
| tungsten oxide, $WO_3$ | 42 |
| yttrium oxide, $Y_2O_3$ | 20 |
| $LaAlO_3$ | 25 |
| BST ($Ba_{1-x}Sr_xTiO_3$) | ~20—~200 |
| $PbTiO_3$ | ~20—~200 |
| $BaTiO_3$ | ~20—~200 |
| $SrTiO_3$ | ~20—~200 |
| $PbZrO_3$ | ~20—~200 |
| PST ($PbSc_xTa_{1-x}O_3$) | ~200—~3000 |
| PZN ($PbZn_xNb_{1-x}O_3$) | ~200—~5000 |
| PZT ($PbZr_xTi_{1-x}O_3$) | ~100—~1000 |
| PMN ($PbMg_xNb_{1-x}O_3$) | ~200—~5000 |

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, hafnium oxide, when stoichiometrically exact, has the chemical formula $HfO_2$. As used herein, the term "hafnium oxide" may include variants of stoichiometric $HfO_2$, which may be referred to as $Hf_xO_y$, in which either of x or y vary by a small amount. For example, in one embodiment, x may vary from about 0.75 to about 1.5, and y may vary from about 1.5 to about 3. In another embodiment, x may vary from about 0.9 to about 1.2, and y may vary from about 1.8 to about 2.2. Such variations from the exact stoichiometric formula fall within the definition of hafnium oxide. Similar variations from exact stoichiometry are included when the chemical formula for a compound is used. For example, again using hafnium oxide as an example, when the formula $HfO_2$ is used, $Hf_xO_y$ as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Here and in all numerical values in the specification and claims, the limits of the ranges and ratios may be combined.

Semiconductor Devices

The present invention is described hereinbelow in terms of a common semiconductor device, specifically, a metal oxide gate dielectric semiconductor field effect transistor (MOSFET) formed on a silicon substrate. An embodiment of the present invention in a MOSFET is shown in FIG. 1. The present invention is not limited to this illustrative embodiment, however, and may be applied to any semiconductor device in which a high-K dielectric material gate dielectric and polysilicon or polysilicon-germanium gate electrode may be used, for example, in A FET, in a floating gate electrode EEPROM flash memory device, in a SONOS-type flash memory device, such as the Mirror-Bit™ two-bit-type flash memory device available from Advanced Micro Devices, Sunnyvale, California. The invention is applicable to any device having a high-K gate dielectric material layer which may be sensitive to hydrogen. Thus, it is to be understood that the present invention is not limited to the specific illustrative embodiments described below.

The present invention relates to a process of making the semiconductor device, in which the semiconductor device includes a semiconductor substrate, a polysilicon gate electrode and a high-K gate dielectric material layer separating the polysilicon gate electrode from the semiconductor device surface. According to the present invention, the polysilicon gate electrode is deposited by a process including non-reducing conditions. The non-reducing conditions may include one or more of, for example, providing a hydrogen-free source of silicon, providing a reduced-hydrogen source of silicon, providing a controlled oxidizing atmosphere for the deposition, excluding hydrogen from the deposition atmosphere, or providing non-hydrogen containing carrier gases to the deposition apparatus. The non-hydrogen carrier gas may include, for example, nitrogen. As used herein, the term "non-reducing conditions" refers generally to conditions maintained in the CVD apparatus during deposition of polysilicon or polysilicon-germanium which either avoid or substantially reduce reduction of the high-K dielectric material.

FIG. 1 is a schematic cross-sectional view of a MOSFET 100. The MOSFET 100 includes, for example, a p-doped silicon substrate 102, an n-doped source region 104, an n-doped drain region 106, a high-K gate dielectric material layer 108, a gate electrode 110, and a channel region 112.

Not shown in FIG. 1 are additional parts of a working semiconductor device, such as electrical conductors, interlayer dielectrics, contacts and other parts of the structure which would be included in a complete, working semiconductor device. These additional parts are not necessary to the present invention, and for simplicity and brevity are neither shown nor described, but could be easily added as will be understood by those of skill in the art.

In one embodiment, the semiconductor substrate is a bulk silicon substrate. In one embodiment, the semiconductor substrate is a silicon-on-insulator semiconductor substrate. In another embodiment, the semiconductor substrate is a p-doped silicon substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate.

Processes for Fabricating a Semiconductor Device

The present invention further relates to a process of making the above-described semiconductor device.

Details of an exemplary process in accordance with the present invention are set forth below. The specific examples provided herein are intended to explain the invention, but are not intended to limit the scope of the invention, which is defined by the attached claims.

Figure 2:
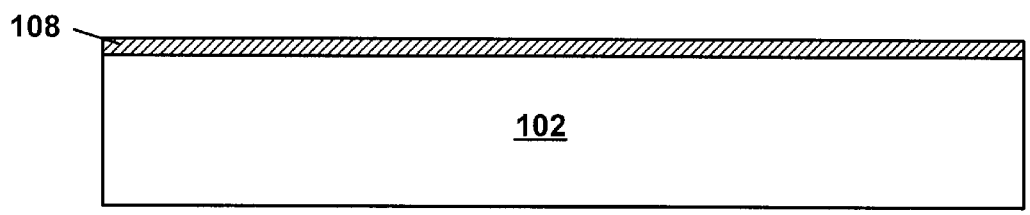
FIG. 2 is a schematic cross-sectional view of a semiconductor substrate with a high-K gate dielectric material layer applied thereto in accordance with an embodiment of the present invention.
Figure 5:
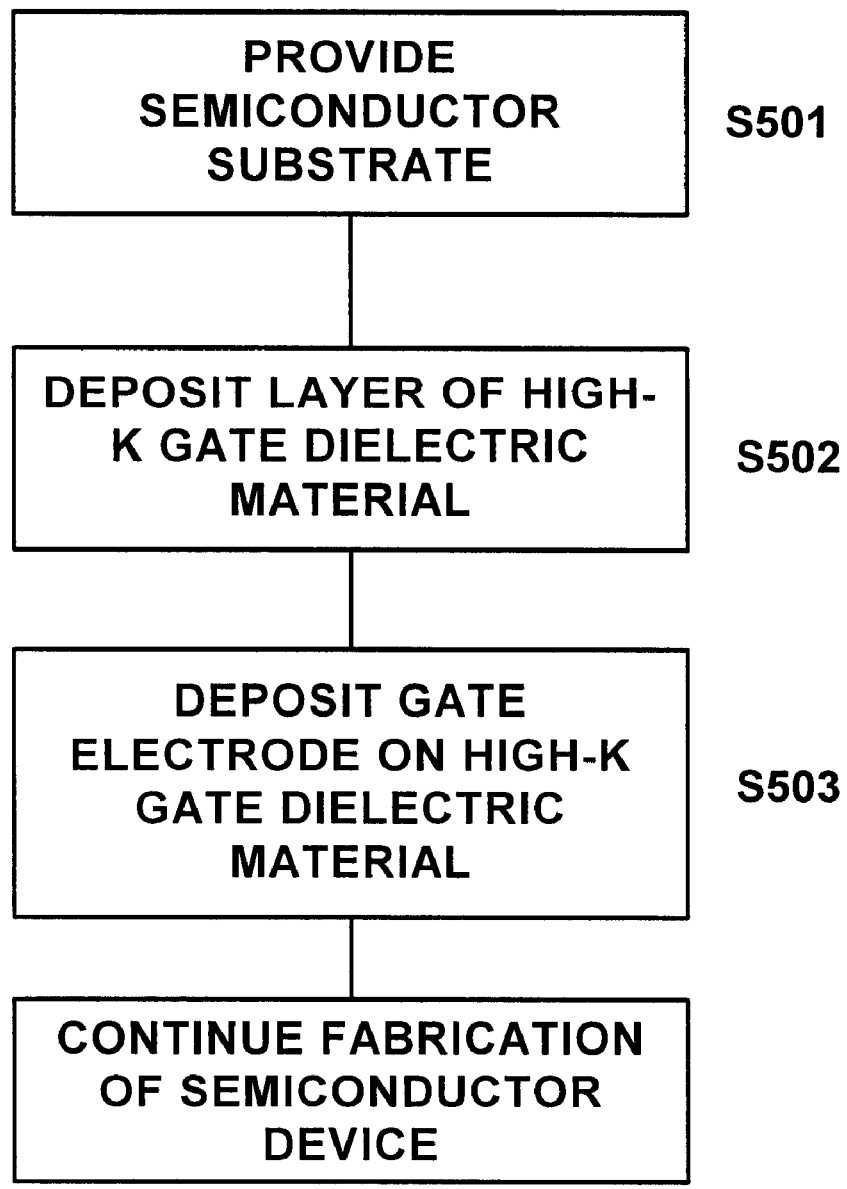
FIG. 5 is a schematic flow diagram showing the basic steps in a process of making a semiconductor device in accordance with the present invention.

In the first step of the process of the present invention, shown in FIG. 5 as Step S501, a semiconductor substrate 102 is provided, as shown in, e.g., FIG. 2. The semiconductor substrate may be any appropriately selected semiconductor substrate known in the art, as described above.

In the second step of the process of the present invention, shown in FIG. 5 as Step S502, a high-K gate dielectric material layer 108 is deposited on the surface of the semiconductor substrate 102. The high-K gate dielectric material layer 108 may be deposited by any method known in the art, and may include any high-K material which is appropriate for use with a semiconductor device. The gate dielectric layer 108 may comprise, for example, any one of a variety of known high-K dielectric materials, such as hafnium oxide, yttrium oxide, lanthanum oxide, and combinations of such high-K dielectric materials with standard-K dielectric materials (e.g., $SiO_2$), such as hafnium silicate, $HfSiO_4$. Suitable exemplary high-K dielectric materials include those disclosed in the above table and associated disclosure. The high-K dielectric materials may be deposited by any appropriate method known in the art. For example, the high-K dielectric material may be deposited by LPCVD, RTCVD, MOCVD or ALCVD. In addition, the high-K dielectric material may be deposited by other methods such as CVD, PVD and sol-gel.

In one embodiment, the high-K gate dielectric material includes at least one of $ZrO_2$, $HfO_2$, $Al_2O_3$, $Y_2O_3$, $La_2O_3$, silicates of one or more of $ZrO_2$, $HfO_2$, $Al_2O_3$, $Y_2O_3$, $La_2O_3$ or aluminates of one or more of $ZrO_2$, $HfO_2$, $Y_2O_3$, $La_2O_3$. In a embodiment, the high-K dielectric material includes at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$). In addition to the foregoing high-K dielectric materials, other high-K dielectric materials, for example, ferroelectric high-K dielectric materials such as lead lanthanum titanate, strontium bismuth tantalate, bismuth titanate and barium zirconium titanate may be suitably used in the present invention. Other high-K dielectric materials known in the art, including, for example binary and ternary oxides having K values of about 10 or higher, also may be used in the present invention.

In one embodiment, the high-K material is a high-K material other than tantalum oxide ($Ta_2O_5$). Tantalum oxide has been found, in some embodiments, to exhibit an undesirably high leakage current.

In one embodiment, the high-K dielectric material has a K value in the range from about 10 to about 2000. In another embodiment, the high-K dielectric material has a K value in the range from about 10 to about 200, and in yet another embodiment, the K value is from about 20 to about 50.

FIG. 2 shows the nascent semiconductor device 100 after deposition of a high-K gate dielectric material layer, i.e., at the completion of step S502. Although only a single high-K gate dielectric layer 108 is shown in FIG. 2, it is understood that multiple layers may be included in the gate dielectric layer 108, as long as the upper surface of the layer 108 comprises a high-K dielectric material.

In the third step of the process of the present invention, shown in FIG. 5 as Step S503, a polysilicon or polysilicon-germanium gate electrode 110 is deposited on the high-K dielectric material layer 108. In the embodiment shown in FIG. 3, the polysilicon gate electrode 110 is deposited by applying a layer 110 of polysilicon or polysilicon-germanium by a suitable, non-reducing CVD method over the surface of the high-K dielectric material layer 108. Portions of the polysilicon or polysilicon-germanium layer 110 will subsequently be etched away, to form the polysilicon or polysilicon-germanium gate electrode 110 shown in FIG. 4.

The polysilicon or polysilicon-germanium is formed under non-reducing conditions in a suitable CVD apparatus. In one embodiment, the non-reducing conditions include providing a hydrogen-free source of silicon, and in some embodiments, germanium, to the CVD apparatus.

In one embodiment, the hydrogen-free source of silicon includes a compound having the general formula $Si_xCl_yF_z$, wherein x=1 or 2, and both y and z are integers from 0 to 6, such that y+z=2x+2. This general formula includes $SiCl_4$, $SiF_4$, $SiClF_3$, $SiCl_2F_2$, $SiCl_3F$, $Si_2Cl_6$, $Si_2F_6$, $Si_2ClF_5$, $Si_2Cl_2F_4$, $Si_2Cl_3F_3$, $Si_2Cl_4F_2$, and $Si_2Cl_5F$. Each of these compounds is an example of a hydrogen-free source of silicon.

In one embodiment, the hydrogen-free source of germanium includes a compound having the general formula $Ge_xCl_yF_z$, wherein x=1 or 2, and both y and z are integers from 0 to 6, such that y+z=2x+2. This general formula includes $GeCl_4$, $GeF_4$, $GeClF_3$, $GeCl_2F_2$, $GeCl_3F$, $Ge_2Cl_6$, $Ge_2F_6$, $Ge_2ClF_5$, $Ge_2Cl_{2F4}$, $Ge_2Cl_3F_3$, $Ge_2Cl_4F_2$, and $Ge_2Cl_5F$. Each of these compounds is an example of a hydrogen-free source of silicon.

In one embodiment, the non-reducing conditions include providing a reduced-hydrogen source of silicon or silicon and germanium to the CVD apparatus. In one embodiment, the reduced-hydrogen source of silicon includes a compound having the general formula $Si_xCl_yF_zH_a$, wherein x=1 or 2, a is an integer $\leq 2x$, and both y and z are integers from 0 to 6, such that y+z+a=2x+2. This general formula includes $SiHCl_3$, $SiHF_3$, $SiHClF_2$, $SiHCl_2F$, $SiH_2Cl_2$, $SiH_2F_2$, $SiH_2ClF$, $Si_2HCl_5$, $Si_2HF_5$, $Si_2HClF_4$, $Si_2HFCl_4$, $Si_2HCl_2F_3$, $Si_2HCl_3F_2$, $Si_2H_2Cl_4$, $Si_2H_2F_4$, $Si_2H_2ClF_3$, $Si_2H_2FCl_3$, $Si_2H_2Cl_2F_2$, $Si_2H_3Cl_3$, $Si_2H_3F_3$, $Si_2H_3ClF_2$ and $Si_2H_3Cl_2F$. Each of these compounds is reduced-hydrogen source of silicon, as compared to a conventional source of silicon for deposition of polysilicon, which is silane, $SiH_4$.

In one embodiment, the reduced-hydrogen source of silicon includes a compound having the general formula $Ge_xCl_yF_zH_a$, wherein x=1 or 2, a is an integer $\leq 2x$, and both y and z are integers from 0 to 6, such that y+z+a=2x+2. This general formula includes $GeHCl_3$, $GeHF_3$, $GeHClF_2$, $GeHCl_2F$, $GeH_2Cl_2$, $GeH_2F_2$, $GeH_2ClF$, $Ge_{2HCl5}$, $Ge_2HF_5$, $Ge_2HClF_4$, $Ge_2HFCl_4$, $Ge_2HCl_2F_3$, $Ge_2HCl_3F_2$, $Ge_2H_2Cl_4$, $Ge_2H_2F_4$, $Ge_2H_2ClF_3$, $Ge_2H_2FCl_3$, $Ge_2H_2Cl_2F_2$, $Ge_2H_3Cl_3$, $Ge_2H_3F_3$, $Ge_2H_3ClF_2$ and $Ge_2Cl_2F$. Each of these compounds is a reduced-hydrogen source of germanium, as compared to a conventional source of germanium for deposition of polysilicon-germanium, which is germanium hydride, $GeH_4$.

In one embodiment, the non-reducing conditions include providing an oxidizing atmosphere to the CVD apparatus, while still using silane, $SiH_4$, as the source of silicon, and germanium hydride, $GeH_4$, as the source of germanium. In another embodiment, in addition to providing a hydrogen-free or a reduced-hydrogen source of silicon or germanium, the non-reducing deposition conditions further include providing a controlled oxidizing atmosphere to the CVD apparatus. The controlled oxidizing atmosphere may include, for example, flowing a small amount of oxygen, $O_2$, nitrous oxide, $N_2O$, nitric oxide, NO, or chlorine, $Cl_2$, or a mixture of any of these gases, or a mixture of any of these gases with nitrogen, into the CVD apparatus during the deposition of the polysilicon or polysilicon-germanium, using any of the above-noted sources of silicon and germanium. In one embodiment, hydrogen, which may be used as a carrier gas in certain CVD processes, is replaced with nitrogen.

The controlled quantity of oxidizing gases provided assures that, even if hydrogen is present (such as when using a hydrogen-containing source of silicon or germanium, such as silane, germanium hydride or one of the reduced-hydrogen compounds), there will be no or substantially no reduction of the metal oxide of the high-K gate dielectric material layer 108 during the deposition of the polysilicon or polysilicon-germanium gate electrode layer 110.

As used herein, the term "controlled oxidizing atmosphere" and similar terms relating to controlled oxidizing conditions, refers to the provision of a small amount of one or more of the above oxidizing gases, for example, a slight stoichiometric excess of oxidizing species over the hydrogen present in the CVD reaction mixture. As will be understood, the purpose of the step of depositing a polysilicon or polysilicon-germanium gate electrode layer is to deposit polysilicon or polysilicon-germanium and not to deposit or form silicon dioxide or germanium dioxide. Accordingly, in one embodiment, the amount of oxidizing gas provided to the CVD apparatus is an amount sufficient to avoid reducing conditions, i.e., to scavenge any hydrogen which may be present, and to avoid reduction of the high-K dielectric material. Thus, the content of the oxidizing gas may be in the range from about 0.1 wt % to about 5 wt % of the gases provided to the CVD apparatus. In one embodiment, the content of oxidizing gas is in the range from about 0.5 wt % to about 3 wt % of the gases provided to the CVD apparatus.

In one embodiment, active steps are taken to exclude hydrogen from the CVD apparatus, such as by providing only hydrogen-free sources of silicon or germanium, providing only hydrogen-free carrier gases, or filtering all incoming gases through a hydrogen scavenger material. In one embodiment, when hydrogen is excluded from the CVD apparatus, an amount of oxidizing gas provided to the CVD apparatus may be in the low end of the ranges disclosed above, or a mixture of one or more of the above oxidizing gases with nitrogen. In another embodiment, when hydrogen is excluded from the CVD apparatus, no oxidizing gas is provided, since no hydrogen and thus no reducing agent is present which could have an undesired effect on the high-K dielectric material.

In one embodiment, while some hydrogen is allowed to be present, or is actually provided to the CVD apparatus, the non-reducing conditions include providing a reduced amount of hydrogen to the CVD apparatus. In one embodiment, the amount of hydrogen which is present is less than an amount which would result in reduction of the high-K metal oxide at the interface between the polysilicon or polysilicon-germanium gate electrode and the high-K dielectric material layer on which the polysilicon or polysilicon-germanium is deposited. In one embodiment, the amount of hydrogen which is present is equal to or less than a stoichiometrically equivalent amount of oxidizing agents such as oxygen, nitrous oxide, chlorine, and other known oxidizing agents for use in CVD processes. In one embodiment, when hydrogen is present, an oxidizing gas is also provided to the CVD apparatus. In such an embodiment, the amount of oxidizing gas provided may be in the ranges set forth above, and in one embodiment, the amount of oxidizing gas provided is in the upper end of the ranges disclosed above.

Thus, in some embodiments, while some hydrogen may be present, hydrogen is present in a reduced amount, so that chemical reduction of the high-K dielectric material is avoided or minimized.

In one embodiment the step of depositing a polysilicon or polysilicon-germanium layer is carried out by LPCVD, RTCVD, MOCVD or ALCVD. In one embodiment, the step of depositing a polysilicon or polysilicon-germanium layer is carried out by a non-plasma CVD process. The non-plasma CVD processes may be preferred since these methods provide more control to the deposition process, and avoid deposition of impurities along with the polysilicon or polysilicon-germanium.

The CVD process may be carried out in suitable CVD apparatus, as known in the art. For example, the RTCVD, MOCVD or ALCVD processes may be carried out in a single-wafer cluster tool. Other suitable CVD apparatus, including an LPCVD batch furnace can be used for depositing polysilicon or polysilicon-germanium.

Figure 3:
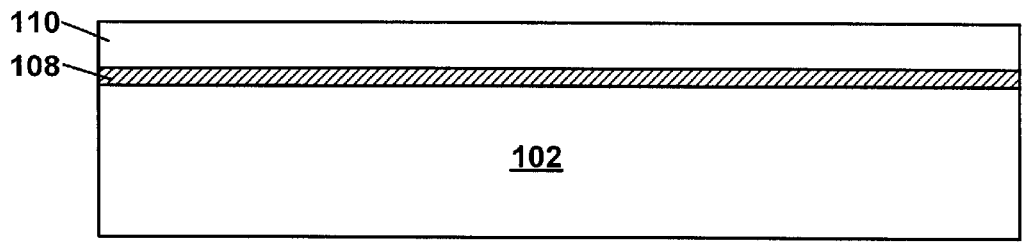
FIG. 3 is a schematic cross-sectional view of a semiconductor substrate with a gate electrode layer deposited thereon in accordance with an embodiment of the present invention.

FIG. 3 shows the nascent semiconductor device 100 after application of a polysilicon or polysilicon-germanium gate layer 110 over the high-K gate dielectric material layer 108, i.e., at the completion of step S503.

Figure 4:
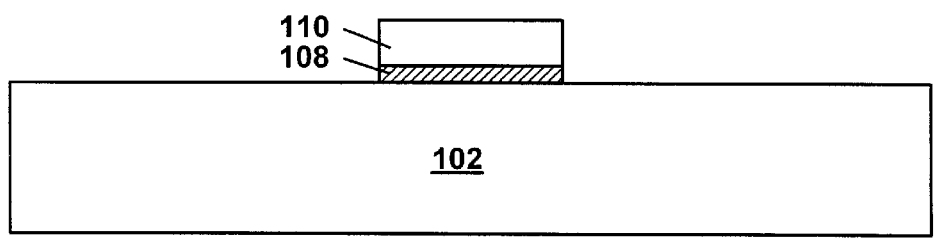
FIG. 4 is a schematic cross-sectional view of a semiconductor substrate following removal of portions of the gate electrode layer and of the gate dielectric layer to form a gate electrode, in accordance with an embodiment of the present invention.

FIG. 4 shows the nascent semiconductor device 100 after the polysilicon or polysilicon-germanium gate layer 110 and the underlying high-K gate dielectric material layer 108 have been etched back to form the gate electrode 110 and the gate dielectric 108.

Upon completion of formation of the polysilicon or polysilicon-germanium gate electrode 110, the high-K gate dielectric material layer 108 and the source and drain 104, 106, the semiconductor device 100 shown in FIG. 1 is obtained. The source and drain may be formed prior to or subsequent to deposition of the high-K gate dielectric material layer 108 and the polysilicon or polysilicon-germanium gate electrode 110, or subsequent thereto, such as by a self-aligned implantation method. Thereafter, the semiconductor device 100 may be further processed as appropriate to the fabrication scheme of which the process of the present invention is a part, as shown in the final step of FIG. 5.

While the invention has been described in conjunction with specific embodiments herein, it is evident that many alternatives, modifications and variations will be apparent to those skilled in the art in light of the foregoing description. Accordingly it is intended to embrace all such alternatives and modifications in variations as for within the spirit and broad scope of the appended claims.

INDUSTRIAL APPLICABILITY

According to the present invention, a polysilicon or polysilicon-germanium gate electrode may be formed on a high-K gate dielectric material layer without reduction of the high-K material by hydrogen in the polysilicon or polysilicon-germanium deposition step. Thus, a distinct, defect-free interface may be formed between these layers, thereby avoiding leakage currents and other problems which may occur when a polysilicon or polysilicon-germanium layer is formed directly on a high-K dielectric material layer by conventional methods, and without requiring or incurring the deposition of a barrier layer, e.g., of silicon dioxide or other dielectric material having a K value lower than that of the high-K dielectric material. The present invention addresses the need for a process of manufacturing MOS semiconductor devices with a high-K dielectric material layer that improves device performance, while avoiding undesirable interactions between elements such as polysilicon in gate electrodes and the high-K gate dielectric materials. The present invention overcomes the problem of forming a polysilicon gate electrode over a high-K gate dielectric material while avoiding reduction of the metal oxide at the interface between the polysilicon gate electrode and the high-K dielectric layer.

What is claimed is:

1. A process for fabricating a semiconductor device, comprising:
   providing a semiconductor substrate;
   depositing on the semiconductor substrate a layer comprising a high-K gate dielectric material;
   depositing on the layer comprising a high-K gate dielectric material a polysilicon or a polysilicon-germanium gate electrode layer in a CVD apparatus, wherein the step of depositing a polysilicon or a polysilicon-germanium gate electrode layer includes providing non-reducing conditions in the CVD apparatus.

2. The process of claim 1, wherein the high-K gate dielectric material comprises at least one of $ZrO_2$, $HfO_2$, $Al_2O_3$, $Y_2O_3$, $La_2O_3$, silicates of one or more of $ZrO_2$, $HfO_2$, $Al_2O_3$, $Y_2O_3$, $La_2O_3$ or aluminates of one or more of $ZrO_2$, $HfO_2$, $Y_2O_3$, $La_2O_3$.

3. The process of claim 1, wherein the non-reducing conditions comprise providing a hydrogen-free source of silicon to the CVD apparatus.

4. The process of claim 3, wherein the hydrogen-free source of silicon comprises a compound having the general formula $Si_xCl_yF_z$, wherein x=1 or 2, and both y and z are integers from 0 to 6, such that y+z=2x+2.

5. The process of claim 1, wherein the non-reducing conditions comprise providing a hydrogen-free source of germanium to the CVD apparatus.

6. The process of claim 5, wherein the hydrogen-free source of germanium comprises a compound having the general formula $Ge_xCl_yF_z$, wherein x=1 or 2, and both y and z are integers from 0 to 6, such that y+z=2x+2.

7. The process of claim 1, wherein the non-reducing conditions comprise providing a reduced-hydrogen source of silicon to the CVD apparatus, in which the source of silicon comprises a compound having the general formula $Si_xCl_yF_zH_a$, wherein x=1 or 2, a is an integer $\leq 2x$, and both y and z are integers from 0 to 6, such that y+z+a=2x+2.

8. The process of claim 7, further comprising providing a controlled oxidizing atmosphere to the CVD apparatus.

9. The process of claim 1, wherein the non-reducing conditions comprise providing a reduced-hydrogen source of germanium to the CVD apparatus, in which the source of germanium comprises a compound having the general formula $Ge_xCl_yF_zH_a$, wherein x=1 or 2, a is an integer $\leq 2x$, and both y and z are integers from 0 to 6, such that y+z+a=2x+2.

10. The process of claim 9, further comprising providing a controlled oxidizing atmosphere to the CVD apparatus.

11. The process of claim 10, wherein providing a controlled oxidizing atmosphere comprises providing oxygen, nitrous oxide, nitric oxide, chlorine or mixtures thereof, or mixtures thereof with nitrogen, to the CVD apparatus.

12. The process of claim 1, wherein the non-reducing conditions comprise providing a controlled oxidizing atmosphere to the CVD apparatus.

13. The process of claim 1, wherein the non-reducing conditions comprise excluding hydrogen from the CVD apparatus, providing a reduced amount of hydrogen to the CVD apparatus, and/or using nitrogen as carrier gas in the CVD apparatus.

14. The process of claim 1, wherein the step of depositing a polysilicon or polysilicon-germanium layer is carried out by LPCVD, RTCVD, MOCVD or ALCVD.

15. A process for fabricating a semiconductor device, comprising:

provisioning a semiconductor substrate;

depositing on the semiconductor substrate a layer comprising a high-K gate dielectric material;

depositing on the layer comprising a high-K dielectric material a polysilicon or polysilicon-germanium gate electrode layer in a CVD apparatus by providing a hydrogen-free source of silicon or hydrogen-free sources of both silicon and germanium to the CVD apparatus.

16. The process of claim 15, wherein the hydrogen-free source of silicon comprises a compound having the general formula $Si_xCl_yF_z$, wherein x=1 or 2, and both y and z are integers from 0 to 6, such that y+z=2x+2.

17. The process of claim 15, wherein the hydrogen-free source of germanium comprises a compound having the general formula $Ge_xCl_yF_z$, wherein x=1 or 2, and both y and z are integers from 0 to 6, such that y+z=2x+2.

18. The process of claim 15, further comprising providing a controlled oxidizing atmosphere to the CVD apparatus.

19. A process for fabricating a semiconductor device, comprising:

providing a semiconductor substrate;

depositing on the semiconductor substrate a layer comprising a high-K gate dielectric material;

depositing on the layer comprising a high-K dielectric material a polysilicon or polysilicon-germanium gate electrode layer in a non-plasma CVD apparatus by providing a hydrogen-free source of silicon or hydrogen-free sources of both silicon and germanium and an oxidizing gas to the non-plasma CVD apparatus.

20. The process of claim 19, wherein the polysilicon or polysilicon-germanium gate electrode layer is deposited without chemical reduction of the high-K gate dielectric material.

* * * * *